United States Patent [19]

Nossek

[11] 4,253,069

[45] Feb. 24, 1981

[54] FILTER CIRCUIT HAVING A BIQUADRATIC TRANSFER FUNCTION

[75] Inventor: Josef Nossek, Munich, Fed. Rep. of Germany

[73] Assignee: Siemens Aktiengesellschaft, Berlin & Munich, Fed. Rep. of Germany

[21] Appl. No.: 26,356

[22] Filed: Apr. 2, 1979

[30] Foreign Application Priority Data

Mar. 31, 1978 [DE] Fed. Rep. of Germany ....... 2813946

[51] Int. Cl.$^3$ .............................................. H03F 1/34
[52] U.S. Cl. ..................................... 330/107; 330/109
[58] Field of Search ........................ 330/107, 109, 294

[56] References Cited

U.S. PATENT DOCUMENTS

| | | | |
|---|---|---|---|
| 3,919,658 | 11/1975 | Friend | 330/69 |
| 3,946,328 | 3/1976 | Boctor | 330/107 |
| 4,015,224 | 3/1977 | Benzinger | 330/107 X |
| 4,132,966 | 1/1979 | Hilberman | 330/107 X |

*Primary Examiner*—James B. Mullins
*Attorney, Agent, or Firm*—Hill, Van Santen, Steadman, Chiara & Simpson

[57] ABSTRACT

An active filter circuit has a biquadratic transfer function and is constructed without coils with the smallest possible number of passive components, particularly capacitors, and comprises a single operational amplifier. A first resistor is connected from the filter input to the non-inverting input of an operational amplifier and a second resistor connects the same input of the operational amplifier to a reference potential. A third resistor is connected between the output of the operational amplifier and the non-inverting input. A first capacitor is connected from the output of the operational amplifier to the inverting input and the same input is connected, by way of a fourth resistor to the reference potential for representation of a low-pass transfer function and a fifth resistor is connected between the input of the filter and the inverting input of the operational amplifier for representing a high-pass transfer function. In addition, a sixth resistor connects the inverting input of the operational amplifier to a junction which is connected to the output of the filter by way of a seventh resistor and to the reference potential by way of an eighth resistor. A second capacitor also connects the filter input to the aforementioned junction. The reference potential is connected to a line extending through the filter and forming one terminal of a pair of input terminals and one terminal of a pair of output terminals. The circuit can be constructed, in particular, in layer technology and is suited as a selection device, particularly in the low-frequency range in communications systems.

7 Claims, 1 Drawing Figure

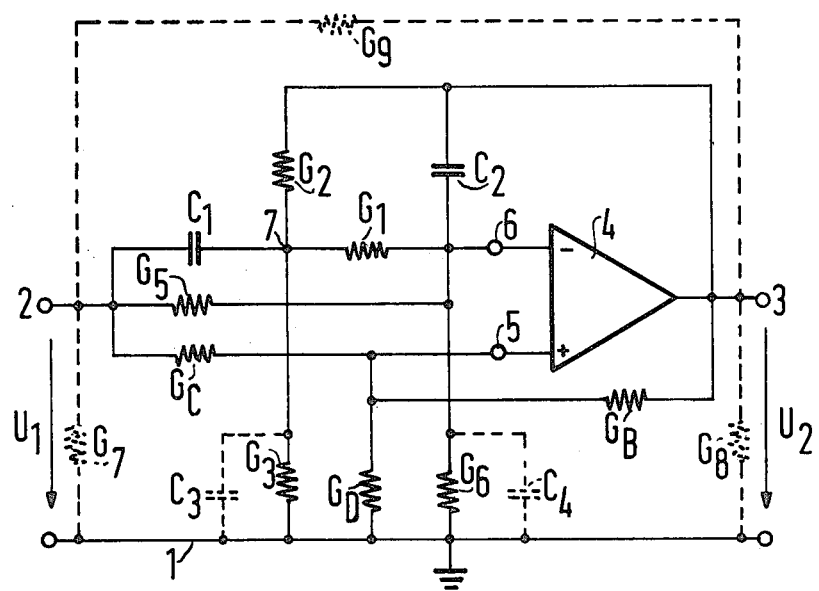

FILTER CIRCUIT HAVING A BIQUADRATIC TRANSFER FUNCTION

BACKGROUND OF THE INVENTION

1. Field of the Invention

The present invention relates to a filter circuit having a biquadratic transfer function which comprises resistors, capacitors and an operational amplifier and which exhibits a through-line lying at a reference potential.

2. Description of the Prior Art

A series of basic circuits for the construction of active filter circuits have already become known in the art. Among other things, it is known to realize active filter circuits, without coils, with the assistance of operational amplifiers. In this connection, a circuit of this type is disclosed in the essay "Single Amplifier Functionally Tunable Low-Pass-Notch Filter" by Stalin A. Boctor (IEEE Transactions of Circuits and Systems, Vol. CAS-22, No. 11, Nov. 1975, pp. 875–881, particularly Page 887 and FIG. 3) which allows a low-pass transfer function of the second degree to be realized with only one operational amplifier. However, it is evident that this known circuit is only suitable for the representation of low-pass transfer functions. Further, in order to attain a sufficient quality, a capacitance relationship of the two capacitors is required in this circuit, which deviates very strongly from the value one and can only be realized with great difficulty, particularly upon construction in layer technology.

SUMMARY OF THE INVENTION

The object of the present invention is to provide a RC filter structure of the type generally mentioned above which is suitable for the representation of any desired transfer functions of the second degree and in which, given sufficient qualities, a capacitance value ratio realizable at low expense is always assured.

Proceeding from a filter circuit having a biquadratic transfer function which consists of resistors, capacitors and an operational amplifier, and which exhibits a through-line lying at a reference potential, the above object is achieved, according to the present invention, in that a first resistor is connected from the filter input to the non-inverting input of the operational amplifier, from which a second resistor is connected to the through-line and a third resistor is connected to the output of the operational amplifier which constitutes the output of the filter. A first capacitor is connected from the output to the inverting input of the operational amplifier, from which a fourth resistor is connected to the through-line and a fifth resistor is connected to the filter input. In addition, a sixth resistor is connected from the inverting input of the operational amplifier to a circuit junction which, in turn, is connected to the filter output by way of a seventh resistor, to the through-line via an eighth resistor, and to the filter input by way of a second capacitor.

The extremely low sensitivity of a circuit constructed in accordance with the present invention, with respect to tolerances of the passive component parts, is of particular advantage, as is the simple manner of realization with the assistance of various technologies, particularly in layer technology, which proceeds therefrom.

BRIEF DESCRIPTION OF THE DRAWING

Other objects, features and advantages of the invention, its organization, construction and operation, will be best understood from the following detailed description, taken in conjunction with the accompanying drawing, on which there is a single FIGURE which is a schematic circuit diagram of a filter circuit constructed in accordance with the present invention.

DESCRIPTION OF THE PREFERRED EMBODIMENTS

Referring to the drawing, a through-line 1 extends through the filter circuit and forms, with the terminal 2, the input of the filter and, with the terminal 3, the output of the filter. The line 1 is connected to a reference potential, for example ground potential. A voltage $U_1$ is connected at the filter input, and a voltage $U_2$ is at the filter output. Proceeding from the filter input 2, a first resistor $G_C$ is connected to the non-inverting input 5 of an operational amplifier 4, whose output at the same time represents the filter output 3, which is particularly advantageous in a technical sense and in view of an integrated manner of construction. In addition, a second resistor $G_D$ is connected from the non-inverting input 5 of the operational amplifier 4 to the line 1 and a third resistor $G_B$ is connected from the non-inverting input 5 of the operational amplifier 4 to the filter output 3. Further, the filter output is connected by way of a first capacitor $C_2$ to the inverting input 6 of the operational amplifier 4, from which a fourth resistor $G_6$ is connected to the line 1 and a fifth resistor $G_5$ is connected to the filter input 2. A sixth resistor $G_1$ is connected from the inverting input 6 of the operational amplifier 4 to a circuit junction 7 from which, on the one hand, a seventh resistor $G_2$ is connected to the filter output 3 and, on the other hand, an eighth resistor $G_3$ is connected to the line 1. A second capacitor $C_1$ is connected between the junction 7 and the filter input 2.

In the basic structure illustrated on the drawing, one of the two resistors $G_5$ and $G_6$ is always dispensible in practice. For the representation of a low-pass transfer function, the following relationship is true for the pole frequency $\omega_p$ and the blocking frequency $\omega_z$:

$$\omega_z < \omega_p$$

and the fifth resistor $G_5$ becomes unnecessary.

For representing a high-pass transfer function, the circuit illustrated is modified by omitting the fourth resistor $G_6$, corresponding to the relationship $$\omega_z < \omega_p.$$

For the case where $\omega_z = \omega_p$, the resistors $G_3$, $G_5$ and $G_6$ become unnecessary.

By means of an analysis of the network with the total transfer function, $$T(p) = U_2/U_1 = N(p)/D(p)$$

given the precondition $$G_4 = G_5 + G_6$$

$$G_A = G_C + G_D$$

one obtains the following polynominals:

$$D(P) = p^2 + p(\omega_p/Q_p) + \omega_p^2$$

$$N(p) = T_o[p^2 + p(\omega_z/Q_z) + \omega_z^2]$$

where $$T_o = a/(1-b) < 1.$$

By means of the relationship $$k = (1-b)C_1C_2,$$

where $$b = (G_B/G_A)/(1 + G_B/G_A)$$

and $$a = (G_C/G_A)/(1 + G_B/G_A),$$

the following expressions result for the blocking frequency $\omega_z$, the pole frequency $\omega_p$ and the qualities $Q_z$ and $Q_p$ for the blocking location and the pole location:

$$\omega_z = \sqrt{\frac{G_1(G_2 + G_3)}{C_1 C_2}}. \tag{1a}$$

$$Q_z = \sqrt{\frac{C_1}{C_2}} \cdot \frac{\sqrt{G_1(G_2 + G_3)}}{G_1 + G_2 + G_3} \cdot \frac{\sqrt{1 + \frac{G_1 + G_2 + G_3}{G_1(G_2 + G_3)} \cdot (G_6 + \frac{a-1}{a} G_5)}}{1 + \frac{C_1}{C_2} \cdot \frac{G_6 + \frac{a-1}{a}(G_1 + G_5)}{G_1 + G_2 + G_3}} \tag{1b}$$

$$\omega_p = \sqrt{\frac{G_1 G_2}{C_1 C_2}} \cdot \sqrt{1 - \frac{b}{1-b} \left[ \frac{G_3}{G_2}(1 + \frac{G_4}{G_1}) + \frac{G_4}{G_2}(1 + \frac{G_2}{G_1}) \right]} \tag{1c}$$

$$Q_p = \sqrt{\frac{C_1}{C_2}} \cdot \frac{\sqrt{G_1 G_2}}{G_1 + G_2 + G_3} \cdot \frac{\sqrt{1 - \frac{b}{1-b} \left[ \frac{G_3}{G_2}(1 + \frac{G_4}{G_1}) + \frac{G_4}{G_2}(1 + \frac{G_2}{G_1}) \right]}}{1 - \frac{b}{1-b} \cdot \frac{C_1}{C_2} \cdot \frac{G_1 + G_4}{C_2 G_1 + G_2 + G_3}} \tag{1d}$$

It proceeds from the equation (1d) for the quality $Q_p$ that for the resistor value $G_B > 0$, the fraction standing farthest from the right is always larger than 1. By means of a corresponding dimensioning, therefore, the quality $Q_p$ can be increased without having to increase the capacitance ratio $C_1/C_2$ for this purpose.

In an advantageous further development of the invention, a capacitor $C_4$ is illustrated on the drawing with broken lines and can be connected parallel to the fourth resistor $G_6$. With this added structure, an increase of the basic amplification $T_o$ occurs. In case a reduction of the basic amplification is required, on the other hand, a capacitor $C_3$, again shown in broken lines, can be connected parallel to the eighth resistor $G_3$.

Dimensioning formulas can be derived from the system of equations (1). For the important special case $\omega_z > \omega_p$ (low pass) and $Q_z \to \infty$ (blocking location on the $j\omega$ axis), the following dimensioning occurs for predetermined values of $C_1$, $C_2$, $G_B$ and $b$:

$$a = T_o(1-b), \quad G_C = G_B \frac{a}{b}, \quad G_D = G_B \frac{1-a-b}{b},$$

$$G_1 = \frac{aT_oC_1C_2}{2(bC_1 - aT_oC_2)} \cdot \left\{ \frac{(2b-1)\omega_p}{T_oQ_p} + \sqrt{\left[\frac{(2b-1)\omega_p}{T_oQ_p}\right]^2 + \frac{C_2}{C_1}\left[\frac{(\omega_p)^2}{Q_p} \cdot (1-b)^2 + \omega_z^2\right]} \right\}$$

$$G_3 = G_1 \left[ \frac{G_1 b}{C_2 a}(1 - \frac{b}{T_o}) - (1-b) \right] + \omega_p C_1 \cdot \left\{ \frac{1 - b + \frac{b}{T_o}(2b-1)}{Q_p} + \frac{\omega_p C_2}{G_1} \left[ \frac{b(1-b)^2}{Q_p^2} - (1-b) \right] \right\}$$

$$G_2 = \frac{\omega_p}{Q_p} C_1(1-b) + G_1(\frac{C_1 b}{C_2 a} - 1) - G_3$$

$$G_4 = G_1 \frac{1 - T_o}{T_o} - \frac{\omega_p}{Q_p} C_2(1-b).$$

The sensitivities S of $\omega_p$ and $\omega_z$ of a circuit constructed in accordance with the present invention are only independent of the dimensioning with respect to the two capacitances and are low:

$$S_{C_1}^{\omega_z} = S_{C_2}^{107_z} = S_{C_1}^{\omega_p} = S_{C_2}^{\omega_p} = -\tfrac{1}{2}.$$

Further, the relationship $$S_{G_C}^{T_o}, -S_{G_D}^{T_o} < 1, \quad S_x^{T_o} = 0,$$
$$x = C_1, C_2, G_1, G_2, G_3, G_5, G_6, G_B.$$

holds true.

If it is a matter of achieving circuit elements which are favorable with respect to technology of production, three further additional resistors can be introduced in the circuit described above. These resistors are illustrated by broken lines on the drawing and are provided with the reference characters $G_7$, $G_8$ and $G_9$. The resistor $G_7$ is connected in the input shunt arm, the resistor $G_8$ is connected in the output shunt arm and the resistor $G_9$ bridges the circuit from the filter input 2 to the filter output 3. Thereby, two of these additional resistors can assume the value of infinity, i.e. only one or also only two additional resistors can be connected as required.

The following consideration holds true for the connection of the resistors $G_7$–$G_9$ which are illustrated by broken lines.

In order to maintain the surface requirements of a filter low upon realization in layer technology such as, for example, in thin-film technology, the impendance level which is always freely available must be optimally selected. Beyond that, a reduction of the resistance sum, given a constant capacitance sum, is usually possible by means of the employment of a $\pi - T$ transformation. Usually, such a resistance $\pi$ element is not present from the very beginning, but a $\pi$ element can often be generated by means of the addition of resistors which do not change the transfer function of the filter. Such resistors can be connected parallel to the filter input (upon usual feed from an ideal voltage source) or, respectively, to the filter output, or they can be connected bridging from the input to the output, as well as parallel to the operational amplifier.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. In an active RC filter with a biquadratic transfer function and of the type which includes an input having first and second input terminals, an output having first and second output terminals, an operational amplifier having an inverting input, a non-inverting input, and an output connected to said first output terminal, and a line connected to said second input terminal and said second output terminal and connected to a reference potential, a first resistor connected between the non-inverting input and the first input terminal, a second resistor connected between the non-inverting input and the line, a first capacitor connected between the inverting input and the first output terminal, a third resistor connected between the inverting input and a junction, a second capacitor connected between the junction and the first input terminal, and a fourth resistor connected between the junction and the line, the improvement therein comprising:

means for providing a low-pass transfer function, including a fifth resistor connected between the first output terminal and the non-inverting input, and a sixth resistor connected between the inverting input and the line.

2. The improvement of claim 1, and further comprising:

for increasing the primary amplification, a third capacitor connected in parallel with said sixth resistor.

3. The improvement of claim 1, and further comprising:

for reducing the primary amplification, a third capacitor connected in parallel with the fourth resistor.

4. In an active RC filter with a biquadratic transfer function and of the type which includes an input having first and second input terminals, an output having first and second output terminals, an operational amplifier having an inverting input, a non-inverting input, and an output connected to said first output terminal, and a line connected to said second input terminal and said second output terminal and connected to a reference potential, a first resistor connected between the non-inverting input and the first input terminal, a second resistor connected between the inverting input and the line, a first capacitor connected between the inverting input and the first output terminal, a third resistor connected between the inverting input and a junction, a second capacitor connected between the junction and the first input terminal, and a fourth resistor connected between the junction and the line, the improvement therein comprising:

means for providing a high-pass transfer function, including a fifth resistor connected between the first output terminal and the non-inverting input and a sixth resistor connected between the inverting input and the first input terminal.

5. The improvement of claim 4, and further comprising:

for reducing the primary amplification, a third capacitor connected in parallel with the fourth resistor.

6. In an active RC filter with a biquadratic transfer function and of the type which includes an input having first and second input terminals, an output having first and second output terminals, an operational amplifier having an inverting input, a non-inverting input, and an output connected to said first output terminal, and a line connected to said second input terminal and said second output terminal and connected to a reference potential, a first resistor connected between the non-inverting input and the first input terminal, a second resistor connected between the inverting input and the line, a first capacitor connected between the inverting input and the first output terminal, a third resistor connected between the inverting input and a junction, a second capacitor connected between the junction and the first input terminal, and a fourth resistor connected between the junction and the line, the improvement therein comprising:

means for providing a low-pass transfer function, including a fifth resistor connected between the first output terminal and the non-inverting input, and a sixth resistor connected between the non-inverting input and the line, a seventh resistor connected between the first and second input terminals, and a eighth resistor connected between the first and second output terminals and a ninth resistor connected between the first output terminal and the first input terminal.

7. In an active RC filter with a biquadratic transfer function and of the type which includes an input having first and second input terminals, an output having first and second output terminals, an operational amplifier having an inverting input, a non-inverting input, and an output connected to said first output terminal, and a line connected to said second input terminal and said second output terminal and connected to a reference potential, a first resistor connected between the non-inverting input and the first input terminal, a second resistor connected between the non-inverting input and the line, a first capacitor connected between the inverting input and the first output terminal, a third resistor connected between the inverting input and a junction, a second capacitor connected between the junction and the first input terminal, and a fourth resistor connected between the junction and the line, the improvement therein comprising:

means for providing a high-pass transfer function, including a fifth resistor connected between the first output terminal and the non-inverting input and a sixth resistor connected between the inverting input and the first input terminal, a seventh resistor connected between the first and second input terminals, a eighth resistor connected between the first and second output terminals, and an ninth resistor conected between the first input terminal and the first output terminal.

* * * * *